United States Patent
Shin et al.

(10) Patent No.: US 7,515,004 B2
(45) Date of Patent: Apr. 7, 2009

(54) VOLTAGE CONTROLLED OSCILLATOR WITH DUTY CORRECTION

(75) Inventors: Sang Cheol Shin, Suwon (KR); Byoung Own Min, Suwon (KR); Chang Woo Ha, Suwon (KR); Jung Chul Gong, Seoul (KR)

(73) Assignee: Samsung Electro-Mechanics Co., Ltd., Suwon, Kyungki-Do (KR)

( * ) Notice: Subject to any disclaimer, the term of this patent is extended or adjusted under 35 U.S.C. 154(b) by 0 days.

(21) Appl. No.: 11/458,577

(22) Filed: Jul. 19, 2006

(65) Prior Publication Data

US 2007/0030081 A1    Feb. 8, 2007

(30) Foreign Application Priority Data

Aug. 3, 2005    (KR)    ............ 10-2005-0071129

(51) Int. Cl.
  *H03B 27/00* (2006.01)
(52) U.S. Cl. .......................... 331/57; 331/74
(58) Field of Classification Search ............... 331/57, 331/74
  See application file for complete search history.

(56) References Cited

U.S. PATENT DOCUMENTS 5,614,868 A * 3/1997 Nielson ............... 331/1 A
6,680,637 B2   1/2004 Seo

FOREIGN PATENT DOCUMENTS

| JP | 06-326573 A | 11/1994 |
|---|---|---|
| JP | 10-022794 A | 1/1998 |
| JP | 2000-232340 A | 8/2000 |
| JP | 2001-068972 A | 3/2001 |
| JP | 2001-156597 A | 6/2001 |
| JP | 2002-135092 A | 10/2002 |
| JP | 2003-198343 A | 7/2003 |
| KR | 1999-47027 A | 7/1999 |
| KR | 19990047027 | 7/1999 |
| KR | 1999-0072222 A1 | 9/1999 |

OTHER PUBLICATIONS

Korean Intellectual Patent Office, Office Action mailed Oct. 25, 2006.
Japanese Patent Office, Office Action issued Jul. 29, 2008.
Japanese Patent Office, Office Action mailed Jan. 8, 2008 and English Translation.

* cited by examiner

*Primary Examiner*—Arnold Kinkead
(74) *Attorney, Agent, or Firm*—Lowe Hauptman Ham & Berner

(57) ABSTRACT

A voltage controlled oscillator (VCO) for generating a clock of a 50% duty includes a VCO unit and a duty correction unit. The VCO unit generates first and second signals having a 180° phase difference to each other with an oscillation frequency according to a control voltage to output the first and second signals through first and second oscillation output terminals. The duty correction unit generates a clock signal of a 50% duty according to the first and second signals through the first and second oscillation terminals.

8 Claims, 6 Drawing Sheets

VOLTAGE CONTROLLED OSCILLATOR WITH DUTY CORRECTION

RELATED APPLICATION

The present application is based on, and claims priority from, Korean Application Number 2005-71129, filed Aug. 03, 2005, the disclosure of which is hereby incorporated by reference herein in its entirety.

BACKGROUND OF THE INVENTION

1. Field of the Invention

The present invention relates to a voltage controlled oscillator (VCO) applied to a phase-locked loop (PLL) of a communication terminal or a broadcasting receiver, and more particularly, to a VCO that can stably generate a clock of a 50% duty from a simple circuit and have an excellent duty correction function in noise.

2. Description of the Related Art

A VCO is an important element used in a tuner or a modem of a communication system or a broadcasting system. Since a system has been complicated, required properties for the VCO become more diverse and strict. Especially, various kinds of systems require a clock of a 50% duty to process data accurately.

FIG. 1 is a view of a related art VCO.

The VCO includes a VCO unit 10 generating a signal S1 with a frequency according to a control voltage VC, and a flip-flop 20 generating a signal Sout with a 50% duty through performing a divide-by-2 on the output signal S1 of the VCO unit.

FIG. 2 is a timing chart of main signals in the VCO of FIG. 1.

Referring to FIG. 2, the signal S1 outputted from the VCO unit 10 has duty lower than 50%. The flip-flop 20 is required to make the signal S1 to be a 50% duty. Then the flip-flop 20 outputs a signal having a 50% duty. Here, the signal Sout outputted from the flip-flop 20 corresponds to a frequency (Fvco/2) that is a half frequency Fvco in the VCO unit 10.

However, the related art VCO needs to generate a frequency outputted from the VCO unit, which is two times higher than a frequency of a final output.

SUMMARY OF THE INVENTION

Accordingly, the present invention is directed to a voltage corrected oscillator (VCO) with duty correction that substantially obviates one or more problems due to limitations and disadvantages of the related art.

An object of the present invention is to provide a VCO stably generating a clock of a 50% duty from a simple circuit to have an excellent duty correction function in noise.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a VCO includes: a VCO unit generating first and second signals having a 180° phase difference to each other with an oscillation frequency according to a control voltage to output the first and second signals through first and second oscillation output terminals; and a duty correction unit generating a clock signal of a 50% duty according to the first and second signals through the first and second oscillation terminals.

The VCO unit may include more than three delay cells of a ring-type oscillation structure, the delay cell having first and second input terminals receiving two input signals with a phase difference of a half period to each other, and first and second output terminals, the delay cell delaying the two input signals through the first and second input terminals for a predetermined delay time according to the control voltage, and then outputting the signals through the first and second output terminals.

The VCO unit further may include first and second inverters connected between first and second output terminals of one delay cell in an odd-number of the delay cells to the first, and second oscillation output terminals, respectively.

A first input terminal of a current delay cell may be connected to a second output terminal of a previous delay cell in the odd number of the delay cells connected in series. A second input terminal of the current delay cell may be connected to a first output terminal of the previous delay cell in the odd number of the delay cells connected in series. An output of an end delay cell may be connected in a positive feedback to an input of a beginning delay cell in the odd number of the delay cells connected in series, the first input terminal and the second output terminal having a reversed phase to each other, the second input terminal and the first output terminal having a reversed phase to each other.

Signals outputted through the first and second output terminals of the delay cell may have an exact 180° phase difference to each other so that the signals are not zero simultaneously in any period.

Each of the plurality of delay cells may include: first and second transistors including drains connected to the first and second output terminals, respectively, and sources connected to ground, respectively; a third and a fourth transistor including drains connected to the drains of the first and second transistors, respectively, and sources criss-crossingly connected to the drains of the first and second transistors, respectively; and a fifth transistor connected between a common source terminal of the third and fourth transistors and a power source to control a drain-source current according to the control voltage in order to adjust a delay time of the input signal.

The duty correction unit may include: a six transistor connected between a power source terminal and an output terminal to be switched according to a second signal through a second oscillation output terminal of the VCO unit; and a seventh transistor connected between the output terminal and ground to be switched according to a first signal through the first oscillation output terminal of the VCO unit.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
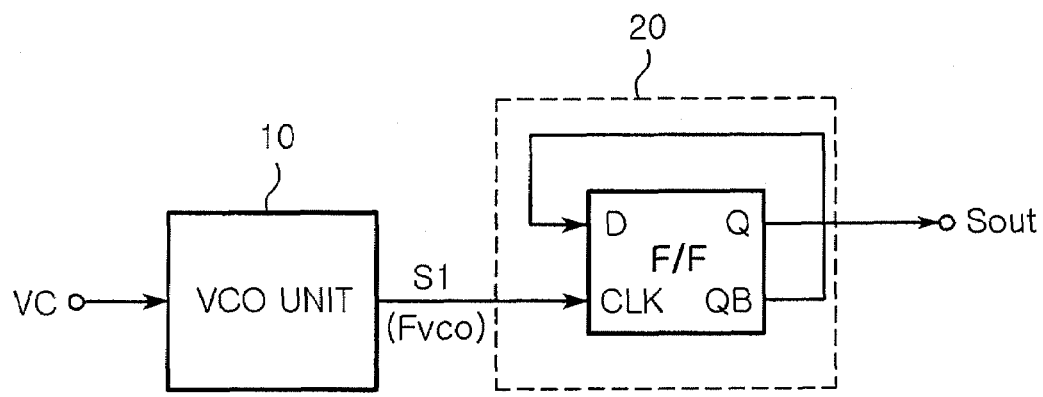
FIG. 1 is a view of a related art VCO.
Figure 2:
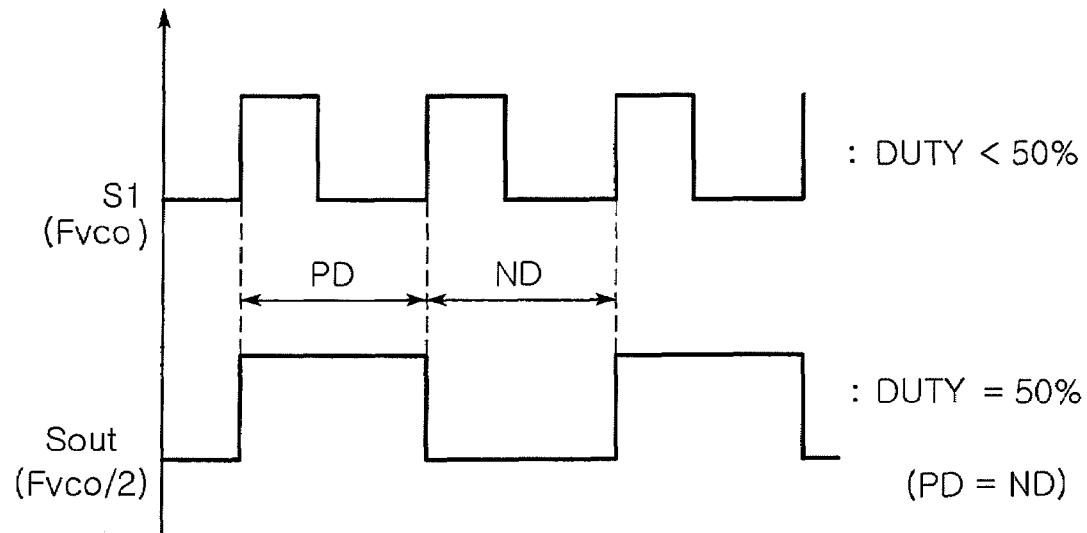
FIG. 2 is a timing chart of main signals in the VCO of FIG. 1.
Figure 3:
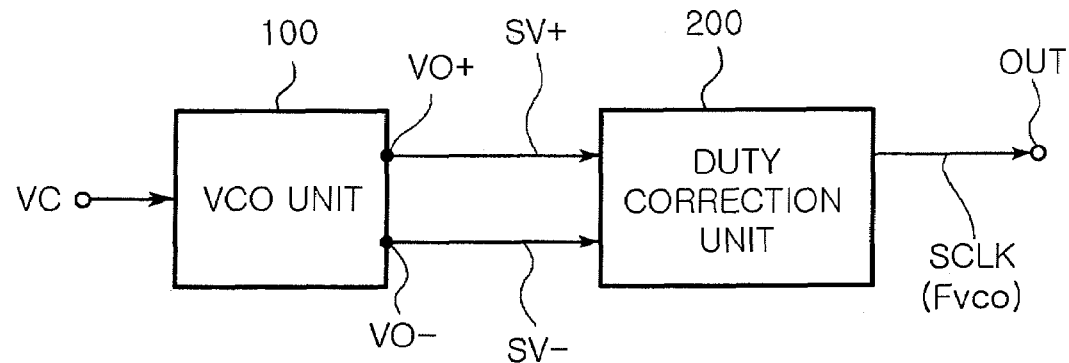
FIG. 3 is a view of a VCO according to an embodiment of the present invention.

FIG. 3 is a view of a VCO according to an embodiment of the present invention.

Referring to FIG. 3, the VCO includes a VCO unit 100 generating first and second signals SV+ and SV− of a 180° phase difference to each other with an oscillation frequency according to a control voltage VC to output the signals SV+ and SV− through first and second oscillation output terminals VO+ and VO−, and a duty correction unit 200 generating a clock signal SCLK with a 50% duty according to the first and second signals SV+ and SV− through the first and second oscillation output terminals VO+ and VO−.

Here, the first and second signals SV+ and SV− have a phase difference corresponding to a half period. Additionally, when a positive duty of the first and second signals SV+ and SV− is set to be less than 50%, a negative duty of those becomes more than 50%. Therefore, the first and second signals SV+ and SV− cannot be zero simultaneously in any period.

Figure 4:
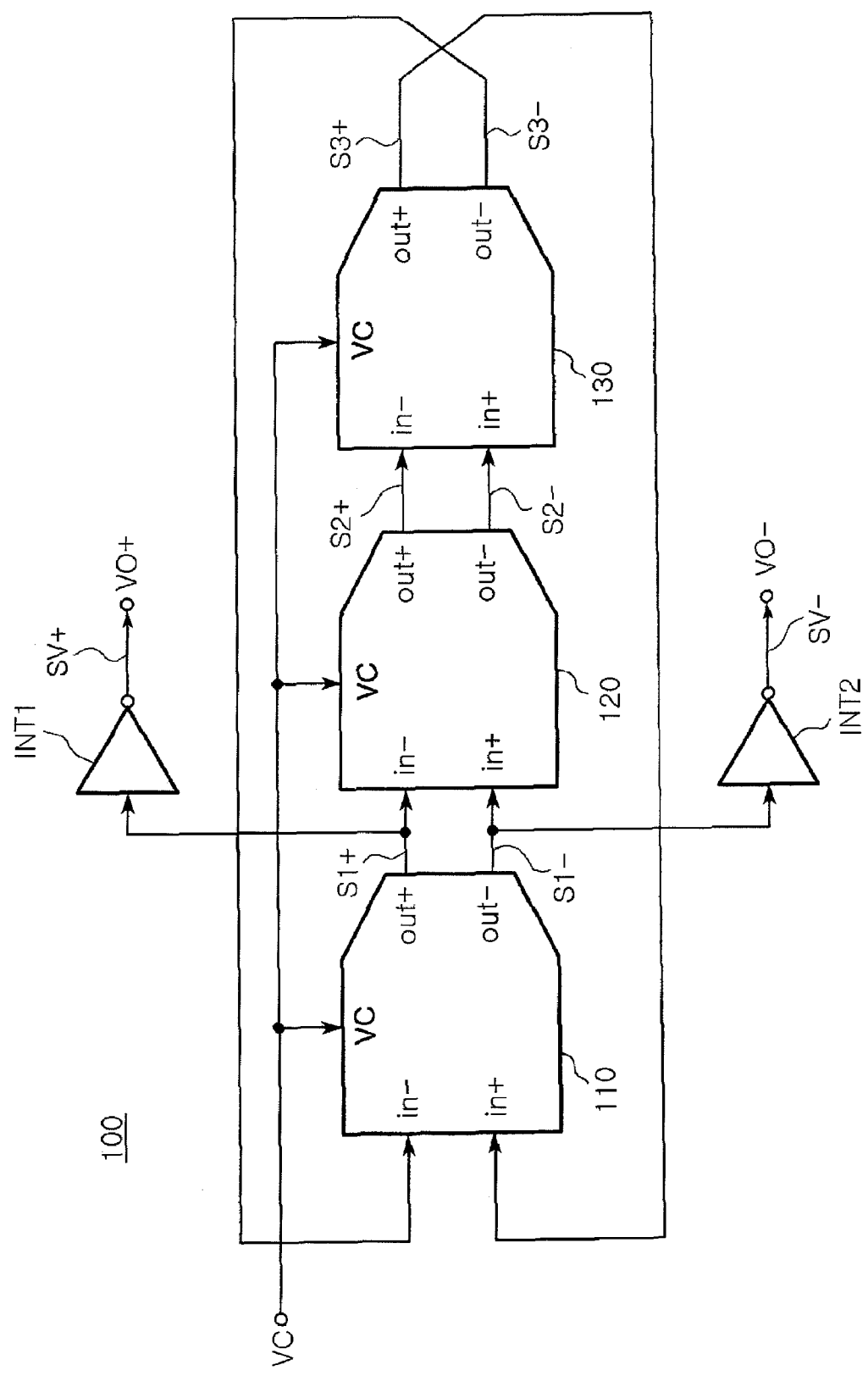
FIG. 4 is an internal view of a VCO unit of FIG. 3.

FIG. 4 is an internal view of a VCO unit of FIG. 3.

Referring to FIG. 4, the VCO unit includes more than three delay cells, and first and second inverters INT1 and INT2. The delay cell includes first and second input terminals in+ and in− inputting two input signals with a 180° phase difference, and first and second output terminals out+ and out−. The delay cell operates according to the control voltage VC to delay the input signals from the first and second input terminals in+ and in− during a predetermined delay time Td. Additionally, the delay cell includes a ring-type oscillation structure outputting the signals through the first and second output terminals out+ and out−. The first and second inverters INT1 and INT2 are connected between the first and second output terminals out+ and out− of one delay cell in a plurality of delay cells, and the first and second oscillation output terminals VO+ and VO−, respectively.

The odd-number of delay cells can include an odd-number of stages with more than three stages. For example, a case of three stages (first, second, and third delay cells 110, 120, and 130) will be described.

In the previous and current delay cells connected in series, the first input terminal in+ of the current delay cell is connected to the second output terminal out− of the previous delay cell, which are an out-of-phase to each other. Moreover, the second input terminal in− of the current delay cell is connected to the first output terminal out+ of the previous delay cell, which are an out-of-phase to each other. In the odd number of the delay cells, the outputs of the last delay cell (the third delay cell 120) are connected in a positive feedback (i.e., respectively identical phases) to the inputs of the first delay cell.

Moreover, the first and second inverters INT1 and INT2 are connected to the first and second output terminals out+ and out− of the first delay cell 110, respectively.

Figure 5:
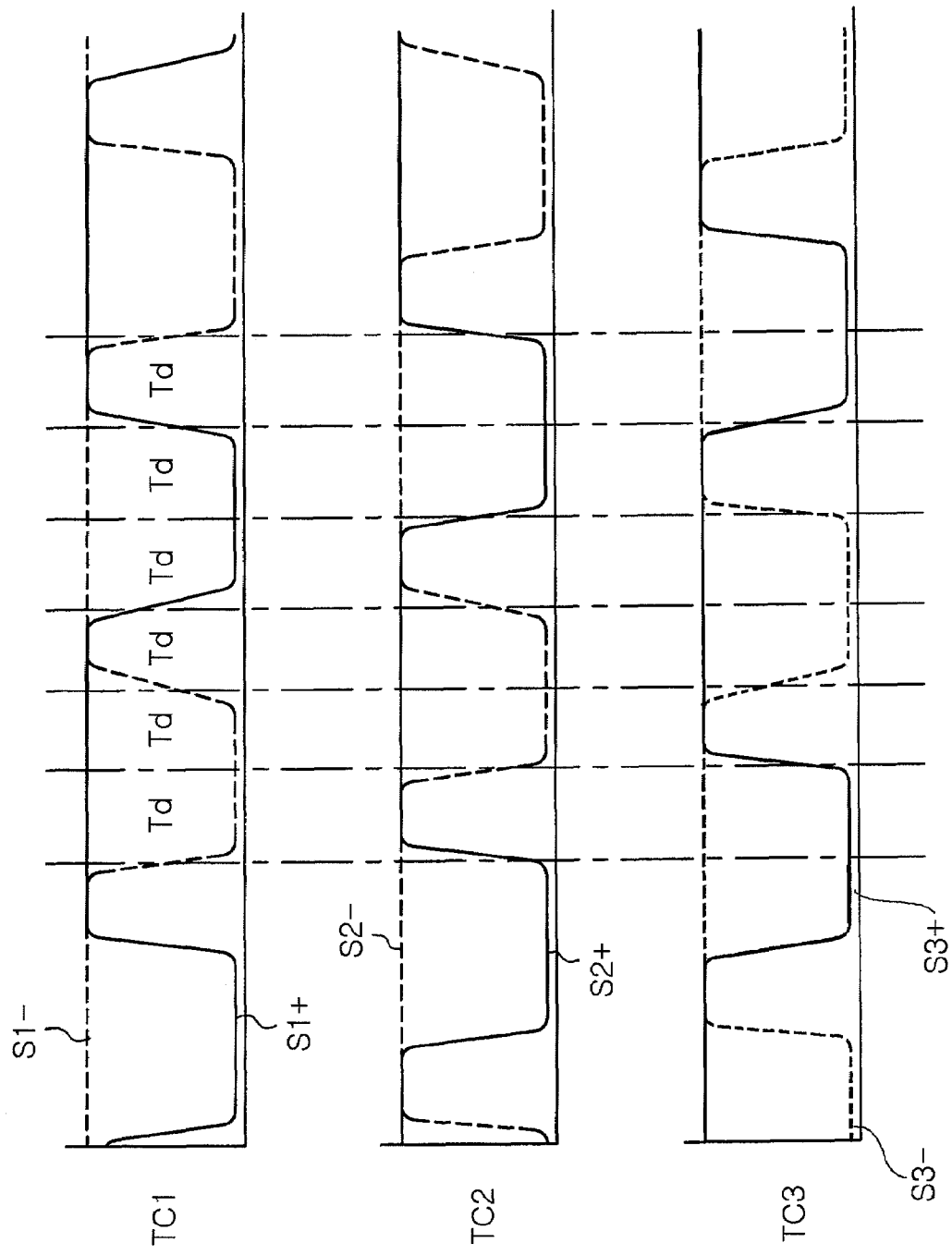
FIG. 5 is a timing chart of an output signal in each delay cell of the VCO unit of FIG. 4.

FIG. 5 is a timing chart of an output signal in each delay cell of the VCO unit of FIG. 4.

Referring to FIG. 5, TC1 represents a timing chart of output signals S1+ and S1− in the first delay cell 110. TC2 represents a timing chart of output signals S2+ and S2− in the second delay cell 120. TC3 represents a timing chart of output signals S3+ and S3− in the third delay cell 130. Td represents a delay time of each delay cell.

Here, signals outputted from the first and second output terminals out+ and out− in each delay cell has a 180° phase difference corresponding to a half period. Additionally, when a positive duty of the signals out+ and out− is set to be more than 50%, a negative duty of those becomes less than 50%. Therefore, two output signals of each delay cell cannot be zero simultaneously in any period.

Figure 6:
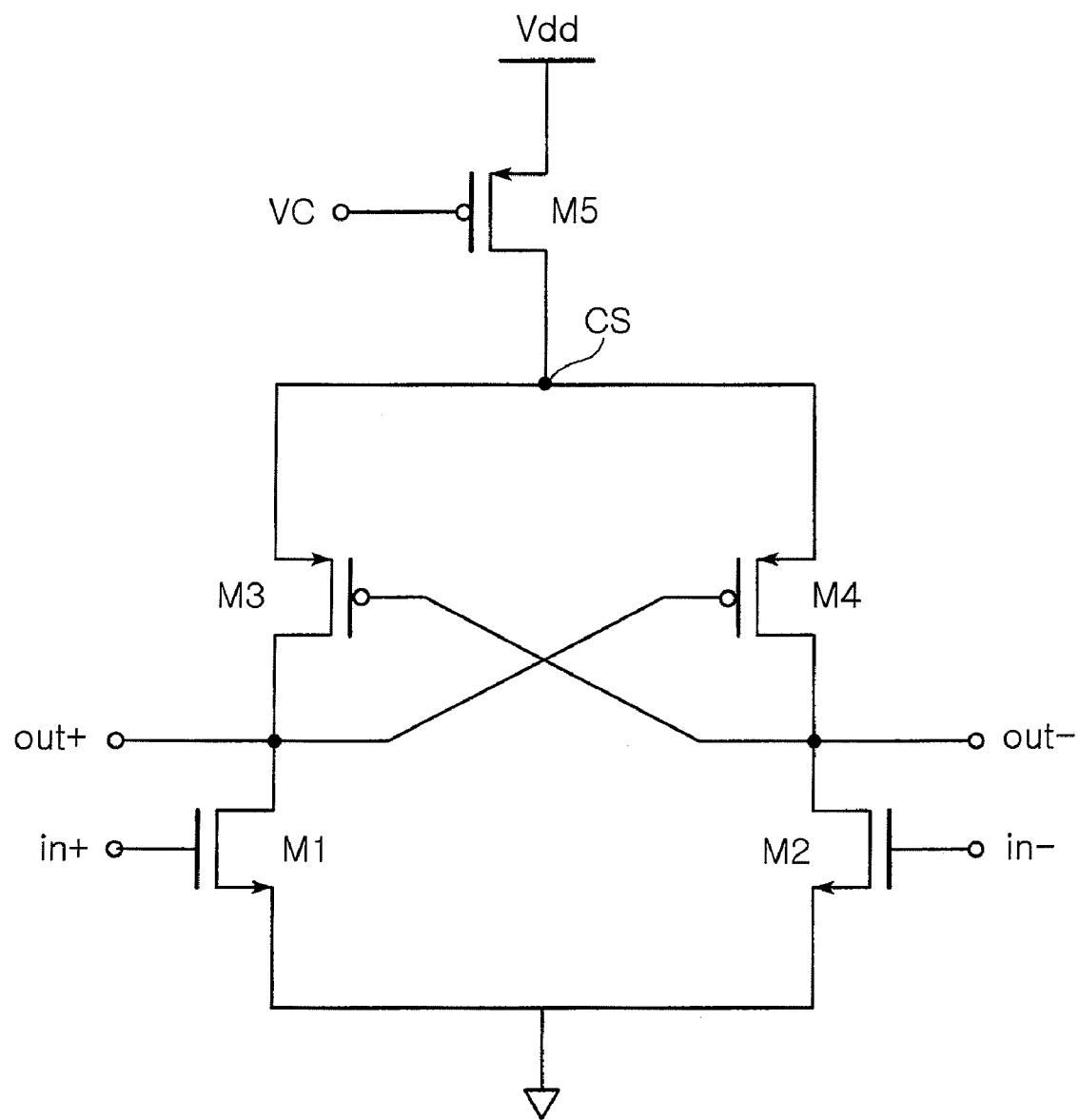
FIG. 6 is a circuit diagram of each delay cell in FIG. 4.

FIG. 6 is a circuit diagram of each delay cell in FIG. 4.

Referring to FIG. 6, each of the first, second, and third delay cells 110, 120, and 130 includes first and second transistors M1 and M2, a third and a fourth transistor M3 and M4, and a fifth transistor M5. The first and second transistors M1 and M2 includes respective gates connected to the first and second input terminals in+ and in−, respective drains connected to the first and second output terminals out− and out+, and respective sources connected to ground. The third and fourth transistors M3 and M4 includes respective drains connected to the drains of the first and second transistors M1 and M2, and respective gates criss-crossingly connected to drains of the first and second transistors M1 and M2. The fifth transistor M5 is connected between a common source terminal CS of the third and fourth transistors M3 and M4, and a voltage source Vdd. The fifth transistor M5 adjusts the delay time Td of the input signal by controlling a drain-source current according to the control voltage VC.

Each of the first, second, and third delay cells 110, 120, and 130 can includes a structure identical to that of FIG. 6. In this case, since each delay cell performs an identical operation, operations of the second delay cell 120 in the first, second, and third delay cells 110, 120, and 130 will be described with reference to a timing chart of FIG. 7.

Figure 7:
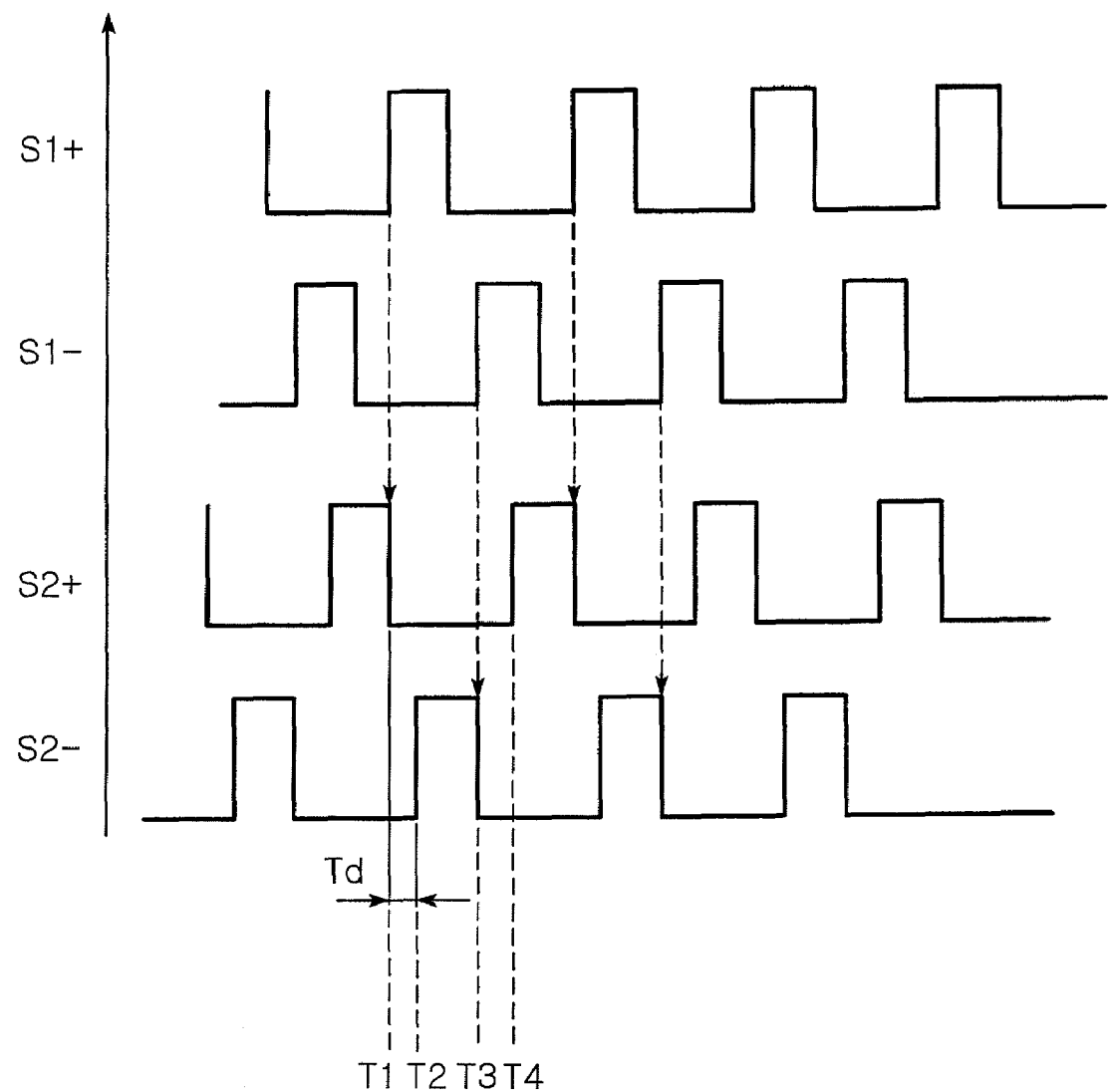
FIG. 7 is a timing chart of input and output signals of a second delay cell of FIG. 6.

FIG. 7 is a timing chart of input and output signals of a second delay cell of FIG. 6.

S1+ represents a signal inputted through the first input terminal in+ of the second delay cell 120. S1− represents a signal inputted through the second input terminal in− of the second delay cell 120. S2+ represents a signal outputted through the output terminal out+ of the second delay cell 120. S2− represents a signal outputted through the second output terminal out− of the second delay cell 120.

Figure 8:
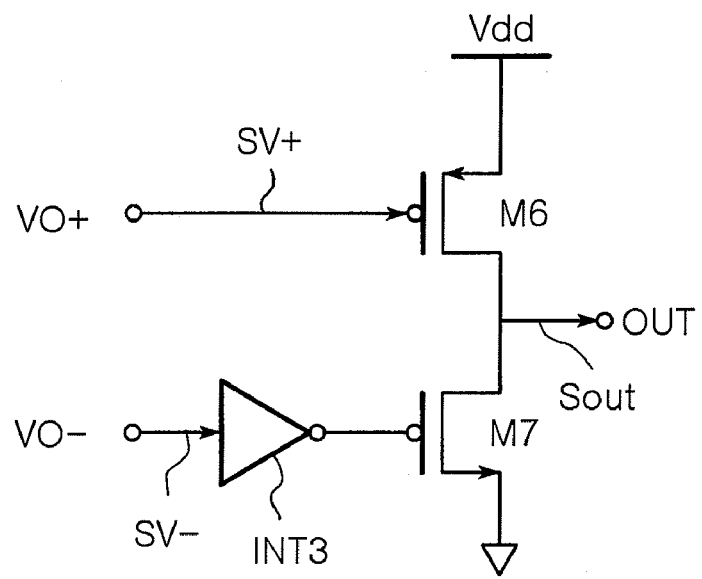
FIG. 8 is a circuit diagram of a duty correction unit of FIG. 3.

FIG. 8 is a circuit diagram of a duty correction unit of FIG. 3.

Referring to FIG. 8, the duty correction unit 200 includes a sixth transistor M6 and a seventh transistor M7. The sixth transistor M6 is connected between a power source terminal Vdd and an output terminal OUT to be switched according to a second signal SV− through the second oscillation output terminal VO− of the VCO unit 100. The seventh transistor M7 is connected between the output terminal OUT and ground to be switched according to a first signal SV+ through the first oscillation output terminal VO+ of the VCO unit 100.

Figure 9:
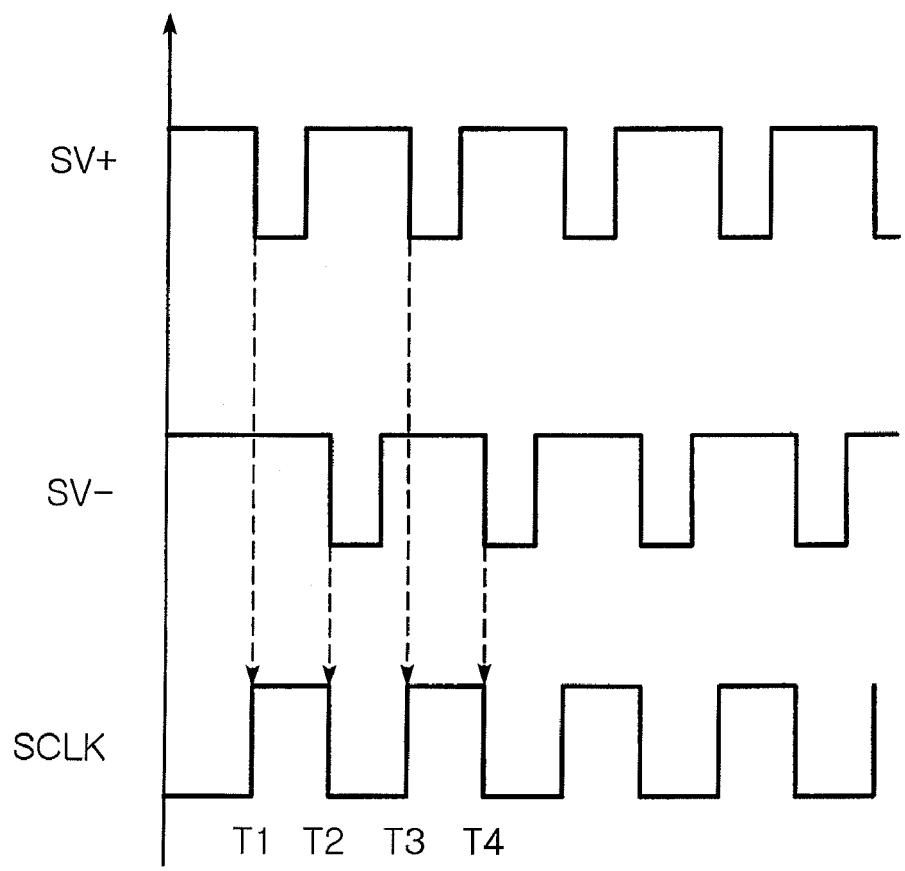
FIG. 9 is a timing chart of input and output signals of the duty correction unit of FIG. 8.

FIG. 9 is a timing chart of input and output signals of the duty correction unit of FIG. 8.

Referring to FIG. 9, SV+ represents a first output signal of the VCO unit 100. SV− represents a second output signal of the VCO unit 100. SCLK represents an output signal of the duty correction unit 200.

Here, since the positive duty of the first and second signals SV+ and SV− is larger than 50%, the sixth and seventh transistors M6 and M7 are not simultaneously turned on.

Hereinafter, actions and effects of the present invention will be described with reference to drawings.

The VCO has a frequency identical to an oscillation frequency, and outputs more a stable clock signal having a 50% duty. This will be described in more detail with reference to FIGS. 3 to 8.

Referring to FIG. 3, the VCO unit 100 has an oscillation frequency according to control voltage VC, and generates the first and second signals SV+ and SV− having a 180° phase difference to output the signals to the duty correction unit 200 through the first and second oscillation output terminals VO+ and VO−.

Next, the duty correction unit 200 generates and outputs a clock signal SCLK having a 50% duty according to the first and second signals SV+ and SV− through the first and second oscillation output terminals VO+ and VO− of the VCO unit 100.

As illustrated in FIG. 8, the first and second signals SV+ and SV− from the first and second oscillation output terminals VO+ and VO− of the VCO unit 100 has an exact 180° phase difference. When a positive duty of the first and second signals SV+ and SV− is set to be less than 50%, a negative duty of those becomes more than 50%. Therefore, the first and second signals SV+ and SV− cannot be zero simultaneously in any period.

The VCO unit 100 will be described with reference to FIG. 4.

Referring to FIG. 4, in the VCO unit 100, the first, second, and third delay cells 110, 120, and 130 are formed of a ring-type oscillation structure. Each of the first, second, and third delay cells 110, 120, and 130 receives two input signals from the first and second input terminals in+ and in−. The two input signals have a 180° phase difference with each other, which corresponds to a half period. The first, second, and third delay cells 110, 120, and 130 delay the signals during a predetermined delay time Td according to the control voltage VC, and then outputs the signals through the first and second output terminals out+ and out−.

Main signals of the VCO unit 100 having the first, second, and third delay cells 110, 120, and 130 of the ring-type oscillation structure will be described with reference to FIGS. 4 and 5.

Referring to FIGS. 4 and 5, since an input signal is delayed for Td by one delay cell, the signal from the first, second, and third delay cells 110, 120, and 130 is delayed for 3Td. The output signal of the third delay cell 130 is connected in a positive feedback to the first delay cell 110. Again, since an input signal is delayed for Td by one delay cell, the signal from the first, second, and third delay cells 110, 120, and 130 is delayed for 3Td. Consequently, the input signal is delayed for 6Td using the ring-type oscillation structure of the first, second, and third delay cells 110, 120, and 130.

At this point, the period of the output signal in the VCO unit 100 is 6*Td, and the frequency of the output signal is the reciprocal of the period (1/(6*Td)). Moreover, signals from each of the first and second output terminals out+ and out− of the first, second, and third delay cells 110, 120, and 130 have an exact 180° phase difference. When the positive duty of each signal from the first and second output terminal out+ and out− is set to be more than 50%, a negative duty of those becomes less than 50%. Therefore, two output signals of a negative duty of those become less than 50%. Therefore, each output signal of the first, second, and third delay cells 110, 120, and 130 cannot be zero simultaneously in any period.

Each of the first, second, and third delay cells 110, 120, and 130 can be embodied using a circuit of FIG. 6.

Referring to FIG. 6, each of the first, second, and third delay cells 110, 120, and 130 is embodied using a circuit of FIG. 6. In circuit operations of each delay cell, signals are inputted through the first and second input terminals in+ and in− connected to the gates of the first and second transistors M1 and M2 of each delay cell. Then, according to the inputted signals, as illustrated in FIG. 7, the first and second transistors M1 and M2 repeatedly performs on/off, off/off, off/on, and off/off in order during one period of the inputted signal.

Each delay cell by these operations outputs a signal illustrated in FIG. 7.

Referring to FIG. 7, the first and second transistors M1 and M2 repeatedly performs on/off, off/off, off/on, and off/off in order during one period of the inputted signal. Accordingly, when a signal of the first input terminal in+ is high, the first transistor M1 is turned on, and also a signal of the first output terminal becomes a low level T1. Accordingly, the fourth transistor M4 is turned on, and also the third transistor M3 is delayed and turned on by a current source of the third transistor M3. At this point, a signal of the second output terminal out− becomes a high level T2.

Moreover, when the signal of the second input terminal in− is high, the second transistor M2 is turned on. At this point, a signal of the second output terminal out− becomes a low level T3. Accordingly, the third transistor M3 is turned on. Then, the forth transistor M4 is delayed and turned on by a current source of the fourth transistor M4. At this point, a signal of the first output terminal out+ becomes a high level T4.

Therefore, the input signal is delayed for Td by each delay cell.

Referring to FIGS. 8 and 9, operations of the duty correction unit 200 will be described in more detail.

Referring to FIG. 8, in the duty correction unit 200, when a signal SV− from the second oscillation output terminal VO− of the VCO unit 100 is a negative edge as illustrated in FIG. 9, the sixth transistor M6 is turned on so that an output OUT rises T1 and T3. Moreover, when a signal SV+ from the first oscillation output terminal VO+ of the VCO unit 100 is a negative edge as illustrated in FIG. 9, the seventh transistor M7 is turned on so that an output OUT falls T1 and T3.

Moreover, a negative duty of the output signals SV+ and SV− in the VCO unit 100 is designed not to be over 50% to prevent the sixth and seventh transistors M6 and M7 from being turned on.

At this point, since the first and second oscillation output terminals VO+ and VO− in the VCO unit 100 has a 180° phase difference, the output signal SCLK guarantees a 50% duty.

As described above, the VCO stably is applied to a PLL of a communication terminal or a broadcasting receiver, and generates a clock of a 50% duty from a simple circuit to have an excellent duty correction function in noise.

That is, the VCO of the present invention can generate a 50% duty regardless of processes, voltage, and temperature. Unlike a complicated circuit of the related art duty correction circuit (DCC), the DCC of the present invention is in a very simple structure. Thus, it is advantageous in terms of miniaturization and cost reduction. Moreover, because of a small number of devices and a latch function, current is not consumed except a state-changing area. The output state guarantees a ground state or a voltage Vdd state.

Moreover, the DCC utilizes one PMOS transistor as a current source to have excellent characteristics in noise.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A VCO (voltage controlled oscillator), comprising:
   a VCO unit generating, at an oscillation frequency and according to a control voltage, first and second signals having a 180° phase difference from each other to output the first and second signals through first and second oscillation output terminals, respectively; and
   a duty correction unit generating a clock signal of a 50% duty according to the first and second signals outputted through the first and second oscillation terminals;
   wherein
   the VCO unit comprises more than three delay cells of a ring-type oscillation structure, each of the delay cells having first and second input terminals receiving two input signals with a phase difference of a half period from each other, and first and second output terminals, the delay cell delaying the two input signals received through the first and second input terminals for a predetermined delay time according to the control voltage, and then outputting the signals though the first and second output terminals;
   a total number of the delay cells in the VCO unit is an odd number and the delay cells are connected in series;
   the first input terminal of any delay cell other than a beginning delay cell in the series is connected to the second output terminal of a previous delay cell in the series, wherein the first input terminal and the second output terminal are reversed in phase relative to each other;
   the second input terminal of said any delay cell is connected to the first output terminal of the previous delay cell, wherein the second input terminal and the first output terminal are reversed in phase relative to each other; and
   the first and second output terminals of an end delay cell in the series are connected in a positive feedback to the first and second input terminals, respectively, of the beginning delay cell.

2. A VCO (voltage controlled oscillator), comprising:
   a VCO unit generating, at an oscillation frequency and according to a control voltage, first and second signals having a 180° phase difference from each other to output the first and second signals through first and second oscillation output terminals, respectively; and
   a duty correction unit generating a clock signal of a 50% duty according to the first and second signals outputted through the first and second oscillation terminals;
   wherein
   the VCO unit comprises more than three delay cells of a ring-type oscillation structure, each of the delay cells having first and second input terminals receiving two input signals with a phase difference of a half period from each other, and first and second output terminals, the delay cell delaying the two input signals received through the first and second input terminals for a predetermined delay time according to the control voltage, and then outputting the signals though the first and second output terminals;
   a total number of the delay cells in the VCO unit is an odd number and the delay cells are connected in series;
   the first input terminal of any delay cell other than a beginning delay cell in the series is connected to the second output terminal of a previous delay cell in the series, wherein the first input terminal and the second output terminal are reversed in phase relative to each other;
   the second input terminal of said any delay cell is connected to the first output terminal of the previous delay cell, wherein the second input terminal and the first output terminal are reversed in phase relative to each other;
   the first and second output terminals of an end delay cell in the series are connected in a positive feedback to the first and second input terminals, respectively, of the beginning delay cell;
   each of the delay cells comprises:
      first and second transistors including drains connected to the first and second output terminals, respectively, and sources connected to ground, respectively;
      third and fourth transistors including drains connected to the drains of the first and second transistors, respectively, and gates connected to the drains of the second and first transistors, respectively; and
      a fifth transistor connected between a common source terminal of the third and fourth transistors and a power source to control a drain-source current according to the control voltage in order to adjust the delay time of the delay cell; and
   the duty correction unit comprises:
      a six transistor connected between a power source terminal and an output terminal to be switched according to the second signal received though the second oscillation output terminal of the VCO unit; and
      a seventh transistor connected between the output terminal and ground to be switched according to the first signal received through the first oscillation output terminal of the VCO unit.

3. The VCO of claim 1, wherein each of the delay cells comprises:
   first and second transistors including drains connected to the first and second output terminals, respectively, and sources connected to ground, respectively;
   third and fourth transistors including drains connected to the drains of the first and second transistors, respectively, and gates connected to the drains of the second and first transistors, respectively; and
   a fifth transistor connected between a common source terminal of the third and fourth transistors and a power source to control a drain-source current according to the control voltage in order to adjust the delay time of the delay cell.

4. The VCO of claim 2, wherein the signals outputted through the first and second output terminals of each delay cell have an exact 180° phase difference from each other so that the signals are not zero simultaneously in any period.

5. The VCO of claim 2, wherein
   the VCO unit further comprises first and second inverters connected between (i) the first and second output terminals of one delay cell in the odd-number of the delay cells, and (ii) the first and second oscillation output terminals, respectively.

6. The VCO of claim 1, wherein the VCO unit further comprises a first inverter connected between the first output terminal of any delay cell other than the end delay cell and the first oscillation output terminal; and a second inverter connected between the second output terminal of said any delay cell and the second oscillation output terminal.

7. The VCO of claim 6, wherein output terminals of the first and second inverters are directly connected to the first and second oscillation output terminals, respectively, whereby signals outputted by the first and second inverters are used directly as output signals of the VCO.

8. The VCO of claim 1, wherein the VCO unit further comprises a first inverter connected between the first output terminal of the beginning delay cell and the first oscillation output terminal; and a second inverter connected between the second output terminal of said beginning delay cell and the second oscillation output terminal.

* * * * *